United States Patent [19]

Vyne

[11] Patent Number: 4,538,116
[45] Date of Patent: Aug. 27, 1985

[54] OUTPUT STAGE FOR AN OPERATIONAL AMPLIFIER

[75] Inventor: Robert L. Vyne, Tempe, Ariz.

[73] Assignee: Motorola, Inc., Schaumburg, Ill.

[21] Appl. No.: 590,948

[22] Filed: Mar. 19, 1984

[51] Int. Cl.³ .............................................. H03F 3/30
[52] U.S. Cl. ................................... 330/271; 330/275; 330/294; 330/298
[58] Field of Search .............. 330/255, 271, 275, 294, 330/298, 307

[56] References Cited

U.S. PATENT DOCUMENTS

| 3,660,773 | 5/1972 | Free | 330/255 |
| 4,403,200 | 9/1983 | Davis | 330/294 |

*Primary Examiner*—James B. Mullins
*Attorney, Agent, or Firm*—Vincent B. Ingrassia; Dale E. Jepsen

[57] ABSTRACT

An operational amplifier includes an input stage, an output stage including first, second and third NPN output transistors, and an intermediate stage. The first NPN output transistor sources load current to an output terminal while the second and third output transistors sink load current therefrom. The output of the intermediate stage is coupled to the base of the third NPN transistor and, via a resistor, to the base of the second NPN transistor. A first Miller capacitor is coupled between the input of the intermediate stage and the amplifier's output terminal, and a second Miller capacitor is coupled between the base of the second NPN transistor and the output terminal.

5 Claims, 1 Drawing Figure

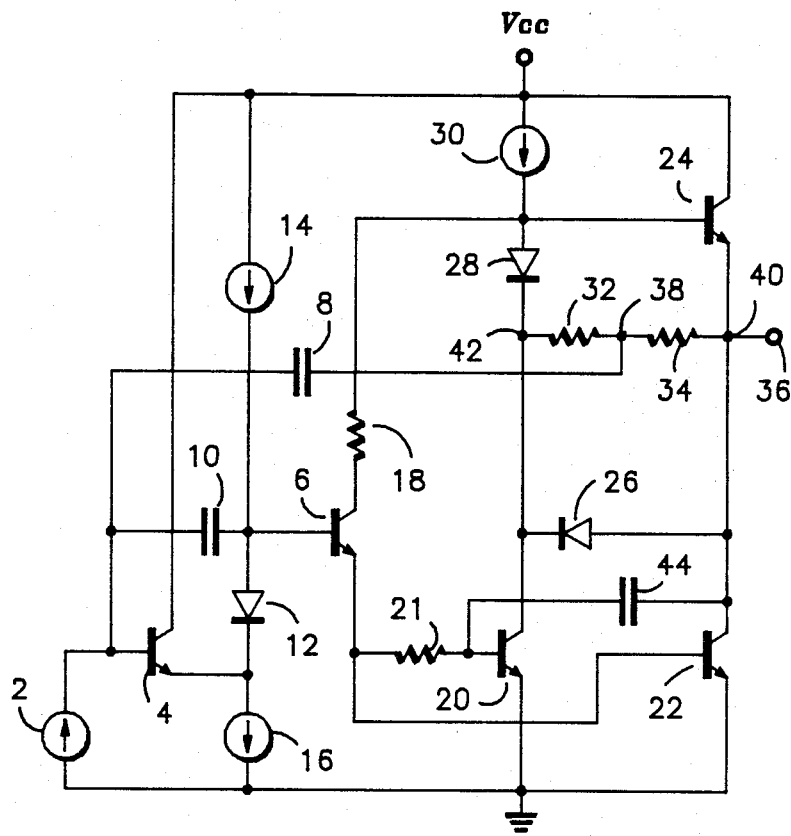

OUTPUT STAGE FOR AN OPERATIONAL AMPLIFIER

BACKGROUND OF THE INVENTION

This invention relates generally to operational amplifiers, and more particularly, to an all NPN monolithically integrable output stage for an operational amplifier which exhibits an improved gain characteristic.

The majority of commercially available operational amplifiers which possess both pull-up and pull-down output capability include PNP devices as part of the output stage. For example, see U.S. Pat. No. 3,660,773. To achieve a higher frequency response, greater output swing, reduced output stage emitter-follower peaking and to simplify the integrated circuit construction, it has been found desirable to provide an output stage which incorporates only NPN transistors. Such an output circuit is shown and described in U.S. Pat. No. 4,403,200 entitled "OUTPUT STAGE FOR OPERATIONAL AMPLIFIER" and assigned to the assignee of the present invention. While the circuit shown and described exhibits satisfactory phase margin (i.e. excess phase at unity gain), the gain characteristic of the device is such that after it passes down through the unity gain frequency, the gain rises again at a higher frequency. If the device has gain at the point where the phase approaches zero, the circuit will oscillate. This tendency to oscillate at higher frequencies in the unity gain configuration renders the frequency response of the device undesirable.

To correct this situation, an improved output stage was developed wherein a Miller capacitor is coupled between the base and collector terminals of at least one of the NPN pull-down output transistor as is shown and described in co-pending application Ser. No. 494,148 filed May 13, 1983 entitled "MILLER COMPENSATION FOR AN OPERATIONAL AMPLIFIER" and now U.S. Pat. 4,513,251, and assigned to the assignee of the present invention. In this manner, the Miller capacitor compensates both the positive and negative loops of the device. However, since the positive or pull-up loop is characterized by more gain than the negative or pull-down loop, the phase performance of the negative loop is seriously degraded. It would therefore be desirable to provide compensation means which primarily affects the positive loop with only a minor effect on the negative loop thus avoiding phase problems in the negative loop.

SUMMARY OF THE INVENTION

It is an object of the present invention to provide an improved operational amplifier.

It is a further object of the present invention to provide an operational amplifier which inlcudes an all NPN output stage and which includes capacitive compensation means for compensating primarily the positive or pull-up loop but which has a minor effect on the negative or pull-down loop.

According to a broad aspect of the invention there is provided an operational amplifier for providing load current to an output terminal, comprising an input stage; an output stage includng first, second and third NPN output transistors, each hving base, emitter and collector terminals, the first NPN output transistor having an emitter coupled to the output terminal for conducting load current thereto and a collector terminal for coupling to a first source of supply voltage, the second NPN output transistor having a collector coupled to the output terminal for sinking load current therefrom and an emitter for coupling to a second source of supply voltage, and the third NPN output transistor having a collector coupled to the output terminal and an emitter for coupling to the second source of supply voltage; at least a first emitter follower transistor having a base terminal coupled to the output of the input stage, a collector coupled to the base of the first NPN output transistor and an emitter coupled to the base of the third NPN output transistor; a first capacitor coupled between the output of the input stage and the output terminal; a resistor coupled between the emitter of the emitter follower transistor and the base of the second NPN output transistor; and a second capacitor coupled between the base of the second NPN output transistor and the output terminal, the first and second capacitors for stabilizing said amplifier.

BRIEF DESCRIPTION OF THE DRAWINGS

The above and other objects, features and advantages of the present invention will be more clearly understood from the following detailed description taken in conjunction with the accompanying drawing which is a schematic diagram of the inventive operational amplifier.

DESCRIPTION OF THE PREFERRED EMBODIMENT

The operational amplifier shown in the drawing includes an input stage (for example a differential input stage of the type well known to those skilled in the art), generally represented by current source 2. Suffice it to say that if the input stage is of the differential type, one set of inputs will result in current being sourced to the base of transistor 4 while another set of inputs will result in base drive being diverted from the base of transistor 4 which is the input of the amplifier's second stage.

Transistor 4 has a collector coupled to a first source of supply voltage ($V_{CC}$) and an emitter coupled to the junction of the cathode of diode 12 and a first terminal of current source 16. The second terminal of current source 16 is coupled to a second source of supply voltage (in this case ground). A stabilizing capacitor 10 is coupled between the anode of diode 12 and the base of transistor 4. The anode of diode 12 is also coupled via current source 14 to $V_{CC}$. The base of transistor 6 is coupled to the junction of capacitor 10 and the anode of diode 12. The collector of transistor 6 is coupled via collector resistor 18 to the base of transistor 24, and the emitter of transistor 6 is coupled to the base electrode of transistor 22 and, via resistor 21, to the base of transistor 20. Transistors 4 and 6 are actually emitter-follower transistors and help supply the required base current loading isolation between the circuit output and the output of the input stage.

Transistors 20 and 22 each have emitters coupled to ground, and a diode 26 is coupled across their collectors; i.e. diode 26 has an anode coupled to the collector of transistor 22 and a cathode coupled to the collector of tranistor 20. The collector of transistor 22 is also coupled to output terminal 36 as is the anode of diode 26 and the emitter of transistor 24. Also coupled across the collectors of transistors 20 and 22 is a series resistor pair comprising resistors 32 and 34 having a junction mode 38.

A first Miller capacitor 8 is coupled between node 38 and the base of transistor 4. As node 38 is moved towards node 40 bringing more resistance into the loop, the circuit exhibits less distortion but its capability to drive capacitive loads without introducing additional excess phase shift is substantially reduced. On the other hand, as node 38 is moved towards node 42 reducing the resistance in the loop, the circuit exhibits more distortion but its capacitive load drive capability is improved.

Transistor 24 has a collector coupled to $V_{CC}$ and a base coupled to the junction of one terminal of current source 30 and the anode of diode 28, the other terminal of current source 30 being coupled to $V_{CC}$. When sufficient base drive is applied to the base terminals of transistors 20 and 22, transistors 20 and 22 will turn on and current will flow from an external load coupled to output terminal 36 through transistors 20 and 22. In fact, load current will flow one-half through transistor 22 and one-half through the series combination of resistors 32 and 34 and then through transistor 20 since the emitter-base junction areas are assumed to be the same. This ratio, however, could be any desired value.

The load current and the values of resistors 32 and 34 are sufficiently small so as not to render diode 26 conductive during normal load current operation. If, for example, half of the load current were two milliamperes and the combination of resistors 32 and 34 have a value of 200 ohms, the voltage drop across the resistors would be 400 millivolts, and thus the voltage at the cathode of diode 28 would be the output voltage appearing at terminal 36 minus 400 millivolts. The voltage at the base of transistor 24 would be approximately 300 millivolts higher than the output voltage at terminal 36 assuming a 700 millivolt drop across diode 28. As a result, this low base-emitter voltage will cause transistor 24 to remain off, transistor 22 will sink one half the load current, and transistor 20 will sink one-half the load current and the current being supplied by current source 30. However, as the voltage at the base terminals of transistors 20 and 22 become sufficiently lower, transistors 20 and 22 will be less conductive and transistor 24 will become more conductive. This occurs because as the current in transistors 20 and 22 is reduced, the current through resistors 32 and 34 will be reduced as will the voltage drop thereacross. If, for example, the drive current through resistors 32 and 34 fell to 100 microamperes, the voltage at the cathode of diode 28 would become equal to the output voltage minus 20 millivolts. Therefore, again assuming a 700 millivolt voltage drop across diode 28, the voltage at the base of transistor 24 would be approximately 680 millivolts higher than the output voltage. This is sufficient to cause transistor 24 to become conductive. As the voltage at the base terminals of transistors 20 and 22 again increase, transistors 20 and 22 will again turn on pulling more current through resistor pair 32 and 34. This in turn will cause a gradual reduction in the voltage at the base of transistor 24 slowly turning it off.

Diode 26 is provided to protect transistor 24 in the event that the output terminal 36 should become shorted to the positive rail ($V_{CC}$) when transistors 20 and 22 are on. Were it not for diode 26, a very high current would flow through resistors 32 and 34 causing a detrimental breakdown of the base-emitter junction of transistor 24 through diode 28. With diode 26 connected as shown, a portion of the short circuit current is conducted through diode 26 and transistor 20 bypassing series resistors 32 and 34. The sourcing portion of the output stage inherently current limits short circuits between output terminal 36 and the negative rail or ground.

A second Miller capacitor 44 is coupled between the base terminal of transistor 20 and the collector terminal of transistor 22. The positive or pull-up loop now includes transistor 4, diode 12, transistor 6, transistor 20, diode 28, transistor 24, resistor 34 and capacitor 8. This is the loop exhibiting the highest gain, and resistor 21 in combination with capacitor 44 reduces the gain of the positive loop increasing its stability by Miller multiplication. The negative or pull-down gain path includes transistor 4, diode 12, transistor 6, transistor 20, transistor 22, resistor 34 and capacitor 8. Thus, compensation capacitor 44 only secondarily affects the gain and therefore the phase of the negative loop. Typically, capacitor 44 may have a value of 2.5 to 5 picofarads. Thus, the phase degradation of a negative loop which was present when the base terminals of transistors 20 and 22 were coupled together has been significantly reduced.

The above description is given by way of example only. Changes in form and details may be made by one skilled in the art without departing from the scope of the invention.

I claim:

1. An operational amplifier for providing load current to an output terminal, comprising:
    an input stage;
    an output stage including first, second and third NPN output transistors, each having base, emitter and collector terminals, said first NPN output transistor having an emitter coupled to said output terminal for conducting load current thereto and a collector terminal for coupling to a first source of supply voltage, said second NPN output transistor having a collector coupled to said output terminal for sinking load current therefrom and an emitter for coupling to a second source of supply voltage, and said third NPN output transistor having a collector coupled to said output terminal and an emitter for coupling to said second source of supply voltage;
    at least a first emitter follower transistor having a base terminal coupled to the output of said input stage, a collector coupled to the base of said first NPN output transistor and an emitter coupled to the base of said third NPN output transistor;
    a first capacitor coupled between the output of said input stage and said output terminal;
    a resistor coupled between the emitter of said emitter follower transistor and the base of said second NPN output transistor; and
    a second capacitor coupled between the base of said second NPN output transistor and said output terminal, said first and second capacitors for stabilizing said amplifier.

2. An operational amplifier according to claim 1 further comprising a diode having an a cathode coupled to the collector of said second NPN output transistor and an anode coupled to the collector of said third NPN output transistor for conducting a short circuit current through said third NPN output transistor if said output terminal becomes shorted to a source of supply voltage.

3. An operational amplifier according to claim 2 wherein said output stage further comprises:
    a first current source coupled between said first source of supply voltage and the base terminal of said first NPN output transistor; and a second diode coupled between said first current source and the collector of said second NPN output transistor, the base of said first NPN output transistor being coupled to the junction of said first current source and the anode of said second diode.

4. An operational amplifier according to claim 3 further comprising a second emitter follower transistor coupled between the output of said input stage and the base of said first emitter follower transistor wherein said second emitter follower transistor has base, emitter and collector terminals, said base being coupled to the output of said input stage and said collector being coupled to said first source of supply voltage, and wherein said first emitter follower transistor has a base coupled to the emitter of said second emitter follower transistor, a collector coupled to the base of said first NPN output transistor and an emitter coupled to the base of said third NPN output transistor.

5. An operational amplifier according to claim 4 further comprising:
- a third capacitor coupled between the base of said first emitter follower transistor and the base of said second emitter follower transistor;
- a third diode having an anode coupled to the base of said first emitter follower transistor and a cathode coupled to the emitter of said second emitter follower transistor;
- a second current source coupled between said first source of supply voltage and the anode of said third diode; and
- a third current source coupled between a cathode of said third diode and said second source of supply voltage.

* * * * *